(12) United States Patent
Kosidlo et al.

(10) Patent No.: US 11,052,824 B2
(45) Date of Patent: Jul. 6, 2021

(54) REAR VIEW DEVICE AND VEHICLE WITH SUCH REAR VIEW DEVICE

(71) Applicant: MOTHERSON INNOVATIONS COMPANY LIMITED, London (GB)

(72) Inventors: Urszula Kosidlo, Stuttgart (DE); Vincent Wilson, London (GB)

(73) Assignee: SMR Patents S.à.r.l., Luxembourg (LU)

( * ) Notice: Subject to any disclaimer, the term of this patent is extended or adjusted under 35 U.S.C. 154(b) by 425 days.

(21) Appl. No.: 16/185,327

(22) Filed: Nov. 9, 2018

(65) Prior Publication Data
US 2019/0143899 A1 May 16, 2019

(30) Foreign Application Priority Data
Nov. 10, 2017 (DE) .................. 102017126404.3

(51) Int. Cl.
*H02N 2/18* (2006.01)
*H01L 41/113* (2006.01)
*H01L 41/18* (2006.01)
*H01L 41/193* (2006.01)
*B60R 1/06* (2006.01)
*B60R 1/12* (2006.01)
(Continued)

(52) U.S. Cl.
CPC .............. *B60R 1/06* (2013.01); *B60R 1/1207* (2013.01); *B60R 16/03* (2013.01); *G02B 7/182* (2013.01); *H01L 41/113* (2013.01); *H01L 41/183* (2013.01); *H02J 7/025* (2013.01); *H02N 2/186* (2013.01); *B60R 1/0602* (2013.01); *B60R 2001/1223* (2013.01); *B60R 2001/1253* (2013.01); *H01L 41/1876* (2013.01); *H01L 41/1878* (2013.01); *H01L 41/193* (2013.01); *H02J 7/345* (2013.01)

(58) Field of Classification Search
CPC ..... H02N 2/186; H01L 41/113; H01L 41/193; H01L 41/183; H01L 41/1878; H01L 41/1876; B60R 1/06; B60R 1/1207; B60R 1/0602; B60R 16/03; B60R 2001/1223; B60R 2001/1253; H02J 7/345
See application file for complete search history.

(56) References Cited

U.S. PATENT DOCUMENTS 6,703,925 B2 3/2004 Steffel
8,031,224 B2 10/2011 Linsenmaier et al.
(Continued)

FOREIGN PATENT DOCUMENTS

DE 102016107545 10/1917
DE 102016108247 11/1917
(Continued)

OTHER PUBLICATIONS

German Office Action dated Sep. 26, 2018, of German application No. 10 2017 126 404.3.

*Primary Examiner* — J. San Martin
(74) *Attorney, Agent, or Firm* — Jones Day

(57) ABSTRACT

An external rear view device for a motor vehicle includes a casing which has at least one part made from a polymer, wherein the at least one part of the casing comprises piezo-electrical particles and at least one conductive element which is in electrical contact with the piezo-electrical particles and inductively coupled to a power storage unit. A motor vehicle with such a rear view device is also described.

13 Claims, 1 Drawing Sheet

(51) Int. Cl.
*B60R 16/03* (2006.01)
*G02B 7/182* (2021.01)
*H02J 7/02* (2016.01)
*H01L 41/187* (2006.01)
*H02J 7/34* (2006.01)

(56) References Cited

U.S. PATENT DOCUMENTS

| | | | |
|---|---|---|---|
| 8,395,514 B2 | 3/2013 | Linsenmaier et al. | |
| 8,979,288 B2 | 3/2015 | Negel et al. | |
| 9,024,510 B1* | 5/2015 | Chen | H02N 2/185 |
| | | | 310/339 |
| 9,105,844 B2* | 8/2015 | Kim | H01L 41/0478 |
| 9,238,434 B2 | 1/2016 | Eder et al. | |
| 9,689,380 B2 | 6/2017 | Wieczorek | |
| 10,147,868 B2* | 12/2018 | Ozawa | H01L 41/183 |
| 2006/0176158 A1* | 8/2006 | Fleming | B60R 16/0232 |
| | | | 340/425.5 |
| 2007/0273971 A1 | 11/2007 | Waldmann et al. | |
| 2011/0222176 A1* | 9/2011 | Browne | B60R 1/074 |
| | | | 359/846 |
| 2016/0096487 A1 | 4/2016 | Konevsky et al. | |
| 2016/0312847 A1* | 10/2016 | Suntsova | B64C 27/001 |
| 2016/0346556 A1* | 12/2016 | Slepian | A61N 1/3785 |
| 2017/0263848 A1* | 9/2017 | Kim | H01L 41/193 |

FOREIGN PATENT DOCUMENTS

| | | |
|---|---|---|
| DE | 102011053999 | 3/2013 |
| EP | 1328141 A2 | 7/2003 |
| EP | 1673260 B1 | 10/2004 |
| EP | 2301803 A1 | 3/2011 |
| EP | 2792556 A1 | 4/2013 |
| EP | 2781743 A1 | 9/2014 |
| EP | 2933155 A1 | 10/2015 |

* cited by examiner

REAR VIEW DEVICE AND VEHICLE WITH SUCH REAR VIEW DEVICE

CROSS-REFERENCE TO RELATED APPLICATIONS

This application claims the benefit of priority to German Patent Application No. 10 2017 126 404.3, filed on Nov. 10, 2017, each of which is hereby incorporated by reference in its entirety for all purposes.

BACKGROUND OF THE INVENTION

1. Field of the Invention

The following description relates to an external rear view device, such as for a motor vehicle, which includes a casing which has at least one part made from a polymer, and a motor vehicle with such a rear view device.

2. Related Art

Different functions and devices can be incorporated into and/or controlled with the help of rear view devices. These functions and devices may enhance, extend and/or sustain the functionality of the rear view device during normal or extreme conditions. Such functions and devices may include heating and/or cooling means, cleaning means such as wipers, liquid and/or gaseous sprays, actuator means for moving the rear view device or parts of it, such as a display, a camera system and/or parts of a camera system including lenses, filters, light sources, adaptive optics like deformable mirrors, sensors, mirrors, and/or actuator means for inducing movement of other objects such as parts of the vehicle and/or objects surrounding the vehicle. Furthermore, such functions and devices may include linear tracks and/or rotating wheels, like a filter wheel for exchanging optical elements including, for example, lenses, mirrors, light sources, sensors, adaptive optics like deformable mirrors, and/or filters.

Some examples of functions and devices incorporated into and/or controlled with the help of rear view devices include illumination devices, for example, any kind of light module like an external light module, an internal light module, a front light, a back light, a fog light, a brake light, an acceleration light, a turn signal, a logo lamp, a puddle light, a flash light, a navigation light, a position light, an emergency light, a spotlight, a green light, a red light, a warning light, a turn signal light module, an approach light, a search light, an information light, a display and/or any combination thereof.

Further examples for functions and devices incorporated into and/or controlled with the help of rear view devices may include, for example, a tiredness detection system, a micro-sleep detection system, a distance and/or velocity determination system such as a LIDAR (Light detection and ranging) system, a blind spot indicator system, a lane change assistant system, a navigation assistant system, a tracking assistant system, a human-machine interaction system, a machine-machine interaction system, an emergency and precaution assistant system—such as an accident avoiding assistant system, a counter-measures assistant system, a brake assistant system, a steering assistant system, an acceleration assistant system, an escape assistant system like an ejection seat system—a direction indicator, a blind spot indicator, an approach system, a strong braking system, an emergency braking system, a charging status indicator, a vehicle mode system—such as a sports mode system, an economy mode system, an autonomous drive mode system, a sleep mode system, and an anti-theft system—a vehicle locked indicator system, a vehicle stolen indicator, a warning signal system, a temperature indicator system, a weather indicator system, a traffic light signal system, a fuel status system, and/or any combination thereof.

A camera module to be used in a rear view device may include a plurality of different optical elements such as a variety of sensors and light sources as well as housing parts. The housing of a camera module can be made out of plastic, metal, glass, any other suitable material and/or any combinations thereof, and can be used in combination with the techniques described below to change or modify the properties of the material or the material surface. Housings are, for example, described in German patent application No. 102016108247. Further, the camera can include, for example, CCD, CMOS, or light field sensors such as described in German patent application No. 102011053999. Also, an area of the sensor can be reserved for different purposes such as to detect a test beam, as described in U.S. Pat. No. 8,031,224, which is hereby incorporated by reference in its entirety for all purposes. The camera module can also be equipped with apparatuses for light intensity adjustment as described, for example, in U.S. patent application Ser. No. 14/809,509, which is hereby incorporated by reference in its entirety for all purposes, and light level intensifier tubes as described in U.S. patent application Ser. No. 09/771,140, which is hereby incorporated by reference in its entirety for all purposes. Still further, the camera module or a cover adapted to the camera module can be moved using different actuators, drives and/or a flexible track, as for example described in German application No. 102016108247.3.

The camera module can also include cleaning elements to clean the optical element facing outwards and being exposed to the environment. The cleaning element can, for example, include wipers, brushes, lips, nozzles, fans and similar elements as are described in European patent application No. 14165197.6, European patent application No. 13163677.1, and European patent No. 1673260 corresponding to US patent application No. 2007/273971, each of which is hereby incorporated by reference in its entirety for all purposes. The cleaning devices are not limited in composition, and may include any fabric, elastomeric, sponge, brush, or combination of these. Special wiper elements including wiper arms, wiper blades, wiping cloth, wiping tissue and combinations thereof are described in European patent application No. 14165197.6. A reservoir for holding a cleaning liquid is described in European patent application No. 14165197.6. Such a reservoir can be attached to or integrated into the camera module to provide the cleaning liquid to the optical elements of the camera module. Different methods may be used to detect dirt or other obscurations preventing or reducing the functioning of the camera module, such as described in U.S. Pat. No. 8,395,514, European patent No. 1328141, and U.S. Pat. No. 8,031,224, each of which is hereby incorporated by reference in its entirety for all purposes. Also light sources can be installed or integrated into the camera module to increase the visibility of surrounding objects, measure distances and directions and detect dirt, such as described in U.S. Pat. No. 8,031,224, U.S. patent application No. 62/470,658, and U.S. patent application Ser. No. 09/771,140, each of which is hereby incorporated by reference in its entirety for all purposes.

Different heating means, like heating coils, heating devices integrated into the lens holder or the bezel, or other heating elements can be used to impede condensation and icing at the surface of optical elements, as described in German patent application No. 102016108247.3, U.S. patent application No. 62/470,658, and German patent application No. 102016107545.0, each of which is hereby incorporated by reference in its entirety for all purposes.

A watertight seal against weather effects, as well as against the influence of washing processes with detergents, solvents and high pressure cleaners can be used on the housing of the camera module, as described in U.S. patent application Ser. No. 13/090,127, which is hereby incorporated by reference in its entirety for all purposes. In another example, the housing can be made of a body including plastic and conductive material, where the conductive material is dispersed in the plastic material to form a conductive mass to allow a power source, preferably a DC voltage source, to connect via at least two electrodes to the body and heat the body accordingly, as described in German patent application No. 102016107545.0. Different types of fixings can be used to fix the camera module to the vehicle or other components, such as the snap-fit connection described in U.S. Pat. No. 8,979,288, which is hereby incorporated by reference in its entirety for all purposes.

Thus, rear view devices are widely known, in particular, in the form of rear view mirrors. They generally include a base, which is affixed to a vehicle, and a head which carries at least a mirror glass and/or a camera and often additional elements such as side turn indicators or the like. The head is usually mounted pivotally movable with respect to the base. This allows the head to move out of the way in case of a minor collision, thereby preventing damage to the head or injury to pedestrians who get hit by the rear view device. Furthermore, the head can be pivoted, either manually or by means of an automatic folding system, from an operating position, in which the rear view device enables the driver of the vehicle to receive a view in particular to the back, to a parking position, in which the head is folded against the side of the vehicle. This reduces the lateral extent of the vehicle with the mirror in the parking position and prevents accidental damage to the mirror of a parked vehicle.

Shape Memory Alloys (SMA) are used for various functions with rear view devices. U.S. patent application Ser. No. 15/165,417, which is hereby incorporated by reference in its entirety for all purposes, relates to an actuator device for a rear view device of a motor vehicle including at least one retaining element, at least one adjusting element which can be transferred into a plurality of functional positions, in particular from a parking position into at least one operating position, at least one driving means which includes at least one shape-memory element which is, in particular, in the form of a wire, which extends between the retaining element and the adjusting element and can be or is secured to both, where the extension of said shape-memory element can be modified on being actuated, in particular on being electrically energized, and by means of the modification of the extension of which the at least one adjusting element can be transferred from one functional position into another functional position, in particular from the parking position into the operating position or vice versa, at least one heat-conducting means which lies in contact with the driving means at least in the end position of the adjusting element, and wherein at least one switching means, by means of which the at least one driving means and the at least one heat-conducting means can be or are arranged with respect to one another with no contact in the basic position of the adjusting element and/or by means of which the at least one driving means and the at least one heat-conducting means can be or are arranged touching one another at least in sections at least in the end position of the adjusting element. A further actuator for an exterior rear view mirror of a vehicle is known from European patent application No. 2781743 and has at least one actuator pin, at least one drum body enclosing a cavity, in which the actuator pin can be arranged or is arranged in a non-rotational manner, at least one clamping means which includes at least one shape-memory element which can be fixed or is fixed to the drum body and with which the drum body can be moved in a first rotational direction, and at least one return means which includes at least one shape-memory element which can be fixed or is fixed to the drum body and with which the drum body can be moved in a second rotational direction, characterized in that the clamping means and/or the return means can be fixed or are fixed on a winding portion of the drum body and in the winding portion of the drum body at least quarter of a winding, in particular at least half a winding, in particular an entire winding, in particular several windings are applied. Rear view devices, in particular those having a high number of additional components integrated, for example mirror actuators, powerfold mechanics, turn signal indicators, logo lights, puddle lights, additional cameras or other sensors to detect specific traffic situations in order to provide warning messages, such as blind spot indicators, exhibit an increased energy demand. Connecting such a rear view device to a vehicle's battery or generator requires a special cabling which leads to a complicated structure as well as an increase of size and weight. In addition, the more load is to be fed by a battery the larger the battery has to be dimensioned which adds further to size and weight.

With the growing number of electrical vehicles, which are range-limited by the storage capacity of their batteries, it is desirable to reduce the energy consumption of all peripheral components in order to improve the range of the vehicle. To this end, various attempts have been made to reduce the energy draw of rear view devices.

EP 2 301 803 A1 discloses a rear view mirror with a self-sustaining energy source provided by piezo-electrical elements, wind turbulence recovery means and/or radio energy recovery means. Such means for energy creation, however, need also to be connected to a battery and/or to other electrical components, again increasing the amount of necessary cabling and the thereby the weight of the rear view device.

SUMMARY

In one aspect, an external rear view device for a motor vehicle includes at least one part of a casing which includes piezo-electrical particles and at least one conductive element which is in electrical contact with the piezo-electrical particles and inductively coupled to a power storage unit.

When external forces, i.e. mechanical forces, such as wind pressure and vibrations caused by the movement of the vehicle, act on such a rear view device, this leads to a deformation of the piezo-electrical particles and consequently to the generation of electrical energy by the piezo-electric effect. The electrical energy is transmitted to the power storage unit via the at least one conductive element and the inductive coupling. The device can thus convert all or at least part of the mechanical energy exerted on the casing to electrical energy and store it without the need for additional cabling. For these reasons, the rear view device may be highly efficient in converting energy while maintaining a low weight.

The mechanical properties of the polymer of the at least one housing part in conjunction with the distribution of the piezo-electrical particles are preferably chosen so that the mechanical deformation of the at least one housing part and thus the deformation of the piezo-electrical particles is sufficient to generate a piezo-electrical potential, for example, in the 0.1 V to 10 V range under the dynamic pressure changes commonly associated with a moving vehicle, e.g. in a dynamic pressure range from 5 Pa to 2000 Pa, corresponding to a speed range of 5 km/h to 200 km/h.

The at least one conductive element may be provided in the form of conductive particles distributed throughout the polymer of the at least one part of the casing, preferably embedded in a polymer matrix.

The at least one part of the casing can thus take up the additional function of providing the galvanic connection of the piezo-electric elements. Since no further electrical connectors like cables or the like are necessary, this allows for a particularly light-weight construction of the rear view device.

The piezo-electric particles may be distributed throughout the polymer, preferably embedded in a polymer matrix, or are applied as a coating to the at least one part of the casing, with preferably the coating being directly applied to the polymer of the at least one part of the casing. Still further, the coating may include at least one of a water-based or solvent-based paint and one polymer layer, preferably including the same polymer as the at least one part of the casing.

This provides a very light construction for the rear view device, since no additional components are needed to provide the desired piezo-electric energy generation capability.

Such coatings can be applied by standard techniques, such as electrostatic painting or dip-coating. Such a rear view device can therefore be manufactured using existing machinery without the necessity of expensive retooling.

A paint coating also allows for design flexibility and fulfilling aesthetic requirements.

When the coating is in immediate contact with the polymer of the at least one part without an intermediate layer such as a primer or the like, a direct galvanic contact between the coating and the conductive polymer of the at least one part of the casing is possible.

The at least one conductive element may include carbon nanotubes and/or carbon nanohorns and/or graphite and/or carbon black and/or graphene nanoplatelets and/or metallic particles, in particular metallic nanoparticles, and/or conductive polymers.

Such particles can be integrated in all of the usual polymers used for injection molding or thermoforming. The at least one part of the casing for such a rear view device can thus be easily and cheaply produced using existent tools.

It is beneficial that the electrically conductive element and the piezo-electrically active particles of the casing are provided as multi-layered structures, preferably a piezo-electrically active layer being sandwiched between two electrically conductive layers acting as electrodes.

The piezo-electrically active particles may include metal-oxide ceramics showing a piezo-electric effect, in particular lead zirconate titanate or calcium bismutate titanate, and/or piezo-electric polymer particles, in particular polyvinylidene fluorides, or composites of oxide and polymer materials.

In addition, the polymer of the at least one part of the casing and/or the polymer layer of the coating may include acrylonitrile butadiene styrene, high-density polyethylene and/or polypropylene.

The energy storage unit may include a battery and/or a capacitor and/or an ultracapacitor and/or supercapacitor.

This may provide that enough electrical energy is available for the other electrical devices of the rear view device, independent of the current power generation of the piezo-electric particles.

A combination of the above may be used, for example, to use capacitors for short term buffering and batteries for long term storage of electrical energy.

The energy storage unit may include at least two electrodes such as electrodes made out of carbon black and/or carbon nanotubes and/or carbon nanohorns and/or graphite and/or graphene and/or graphene nanoplatelets.

Such electrodes may be particularly efficient while at the same time being very light.

The energy storage unit may include a separator medium such as a liquid, a solid, a gas or air or a gel.

The separator medium can be chosen depending on the electrode types used and the capacity and voltage demands to the energy storage unit.

The energy storage unit may be connected to or may be suited for being connected to at least one energy consuming device which is incorporated into and/or controlled with the help of the rear view device.

The energy consuming device can be any one of those described in the introduction of this specification.

In another aspect, a motor vehicle includes a rear view device as described above.

BRIEF DESCRIPTION OF THE DRAWINGS

The foregoing summary, as well as the following detailed description, will be better understood when read in conjunction with the appended drawings. For the purpose of illustration, certain examples of the present description are shown in the drawings. It should be understood, however, that the invention is not limited to the precise arrangements and instrumentalities shown. The accompanying drawings, which are incorporated in and constitute a part of this specification, illustrate an implementation of system, apparatuses, and methods consistent with the present description and, together with the description, serve to explain advantages and principles consistent with the invention.

Figure 1:
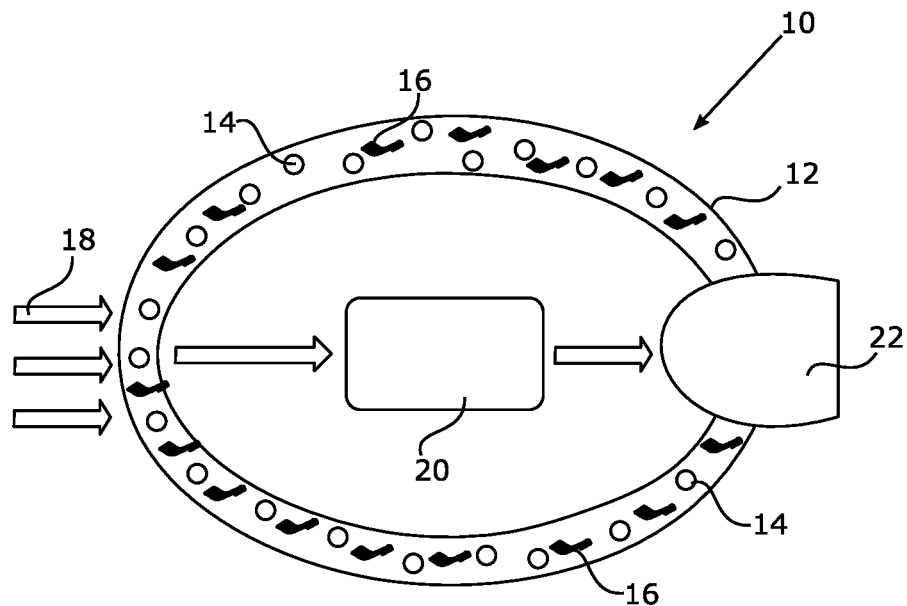
FIG. 1 is a schematic representation of an example of a rear view device.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Before explaining at least one example of the invention in detail, it is to be understood that the invention is not limited in its application to the details of construction and to the arrangements of the components set forth in the following description or illustrated in the drawings. The Figures and written description are provided to teach any person skilled in the art to make and use the inventions for which patent protection is sought. The invention is capable of other embodiments and of being practiced and carried out in various ways. Those skilled in the art will appreciate that not all features of a commercial embodiment are shown for the sake of clarity and understanding. Persons of skill in the art will also appreciate that the development of an actual commercial embodiment incorporating aspects of the present inventions will require numerous implementation-specific decisions to achieve the developer's ultimate goal for the commercial embodiment. While these efforts may be complex and time-consuming, these efforts nevertheless would be a routine undertaking for those of skill in the art having the benefit of this disclosure.

In addition, it is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity in specific reference to the Figures and are not intended to limit the scope of the invention or the appended claims. Further, it should be understood that any one of the features of the invention may be used separately or in combination with other features. Other systems, methods, features, and advantages of the invention will be or become apparent to one with skill in the art upon examination of the Figures and the detailed description. It is intended that all such additional systems, methods, features, and advantages be included within this description, be within the scope of the present invention, and be protected by the accompanying claims.

It will be appreciated by those skilled in the art that changes could be made to the embodiments described above without departing from the broad inventive concept thereof. It is understood, therefore, that the invention disclosed herein is not limited to the particular embodiments disclosed, but it is intended to cover modifications within the spirit and scope of the present invention as defined by the appended claims.

The term "rear view" is here defined as a view of the surrounding area, which is not in the field of view of a driver, i.e. the directions opposing, left, right, below and above of the viewing direction, but can also include the view in the direction of the viewing direction of the driver and/or any combinations of the directions.

The term "driver" and "driver of the vehicle" relates here to the person controlling the main parameters of the vehicle, such as for example direction, speed and/or altitude, e.g. normally the person located in the location specified for the controlling person, for example a seat, but can also relate to any other person or entity within or outside of the vehicle.

Referring to FIG. 1, a rear view device 10 may be attached externally to a vehicle to carry at least one reflective element and/or camera. It may include a casing 12, which is manufactured from a polymer in an injection molding process. Suitable polymers are for example ABS (acrylonitrile butadiene styrene), HDPE (high-density polyethylene) or PP (polypropylene).

In the example shown in FIG. 1, piezo-electric particles 14 and conductive particles 16 are embedded in the polymer matrix of the casing 12. The piezo-electric particles 14 can for example include various metal-oxide ceramics showing a piezo-electric effect, such as PZT (lead zirconate titanate) or calcium bismutate titanate. It is further possible to use or to include piezo-electric polymer particles, for example polyvinylidene fluorides, or composites of oxide and polymer materials.

The conductive particles 16 can include, but are not limited to, various forms of carbons such as carbon nanotubes (CNTs), carbon nanohorns (CNHs), graphite, carbon black (CB), graphene, graphene nanoplatelets (GNPs) and others, metal particles in spherical or fibre form especially in nano-dimensions, and conducting polymers.

When external forces, symbolized by the arrows 18, act upon the casing 12, the piezo-electric particles 14 are deformed and provide an electrical current. Such forces include vibrations and air pressure forces generated by the movement of the vehicle, to which the rear view device 10 is attached, the impact of raindrops on the casing 12, and the like. Even the pressure applied during car wash can be transformed into electrical current.

The mechanical properties of the polymer of the casing 12 and the distribution of the piezo-electrical particles 14 within said polymer are preferably chosen so that the mechanical deformation of the piezo-electrical particles 14 is sufficient to generate a piezo-electrical potential for example in the 0.1 V to 10 V range under the dynamic pressure changes commonly associated with a moving vehicle, e.g. in a dynamic pressure range from 5 Pa to 2000 Pa, corresponding to a speed range of 5 km/h to 200 km/h.

The piezo-electrical potential and, thus, the energy created may be inductively transferred to an energy storage unit 20, which acts as a buffer and is suited to further distribute electrical energy to other electric components of the rear view device 10, such as a side-turn indicator light 22. The electrical connection between the energy storage unit 20 and the other electrical components may preferably be inductive as well.

The energy storage unit 20 may be or may include a battery of any type, for example NiCad, NiMH, lithium ion, lead acid, sulphur and others, or any capacitor device, for example film capacitors, ceramic capacitors or electrolytic capacitors, including supercapacitors and ultracapacitors like EC double layer capacitors, pseudocapacitors and hybrid capacitors.

The energy storage unit 20 may use as a separator a liquid, gel, solid or air. The electrodes of the energy storage unit 20 may be made of standard materials, especially from various forms of carbon like carbon black (CB) or graphite but especially favoured are those utilising carbon nanoparticles like carbon nanotubes (CNTs), carbon nanohorns (CNHs), graphene, graphene nanoplatelets (GNPs) and others.

Furthermore, the energy storage unit 20 may include additional electronic components like rectifiers, voltage stabilizers, charging circuits and the like.

Figure 2:
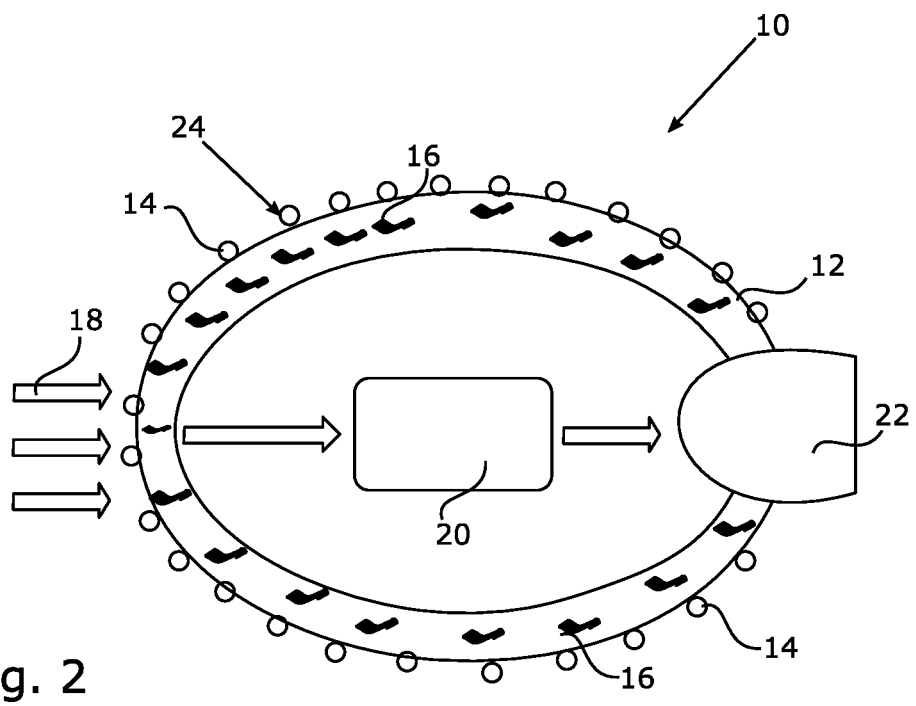
FIG. 2 is a schematic representation of another example of a rear view device.

In another example as shown in FIG. 2, the polymer matrix of the casing 12 may contain only electrically conductive particles 16, while the piezo-electrical particles 14 are applied as an outer layer 24 of the casing 12. The conductive part of the casing 12 may again transport the generated electrical energy and wirelessly transfer it to the energy storage unit 20.

Electrical contact between the piezo-electrical particles 14 in the layer 24 and the electrically conductive particles 16 in the polymer matrix of the casing 12 is to be ensured.

The layer 24 can be applied in form of a water-based or solvent-based paint, which can be used in a standard electrostatic painting or dip-coating process. It is of benefit not to use a primer, as this omission makes the painting process shorter and cheaper.

It is further possible to apply the layer 24 as a polymer layer, preferably using the same polymer matrix as for the casing 12. Suitable polymers are for example ABS (acrylonitrile butadiene styrene), HDPE (high-density polyethylene) or PP (polypropylene). The layer 24 can be manufactured together with the casing 12 in a two-component injection molding process. In another example, the layer 24 can be applied to the finished casing 12 in an overmolding step. Furthermore, the layer 24 can be provided in the form of an adhesive foil or film, or as part of a multi-layered foil or film.

The electrically conductive and piezo-electrically active parts of the casing 12 can also be provided as multi-layered structures. It is, for example, possible to sandwich a piezo-electrically active layer between two electrically conductive layers acting as electrodes.

In various aspects and among example advantages, a light rear view device 10 is provided by not requiring cables and having excellent energy regeneration capabilities.

The above description of the disclosed examples is provided to enable any person skilled in the art to make or use the invention. Various modifications to these examples will be readily apparent to those skilled in the art, and the generic principles described herein can be applied to other examples without departing from the spirit or scope of the invention. Thus, it is to be understood that the description and drawings presented herein represent presently preferred examples of the invention and are therefore representative of the subject matter which is broadly contemplated by the present invention. It is further understood that the scope of the present invention fully encompasses other examples that may become obvious to those skilled in the art and that the scope of the present invention is accordingly limited by nothing other than the appended claims.

REFERENCE SIGN LIST 10 rear view device
12 casing
14 piezo-electric particle
16 conductive particle
18 arrow
20 energy storage unit
22 side-turn indicator light
24 layer

What is claimed is:

1. An external rear view device for a motor vehicle, comprising
   a casing which comprises at least one part made from a polymer;
   piezo-electrical particles; and
   at least one conductive element which is in electrical contact with the piezo-electrical particles and inductively coupled to a power storage unit,
   wherein the at least one part of the casing comprises the piezo-electrical particles and the at least one conductive element.

2. The external rear view device according to claim 1, wherein the at least one conductive element comprises conductive particles distributed throughout the polymer of the at least one part of the casing and embedded in a polymer matrix.

3. The external rear view device according to claim 1, wherein the piezo-electric particles are distributed throughout the polymer and embedded in a polymer matrix, or are applied as a coating to the at least one part of the casing with the coating being directly applied to the polymer of the at least one part of the casing.

4. The external rear view device according to claim 3, wherein the coating comprises at least one of a water-or-solvent-based paint and one polymer layer comprising the same polymer as the at least one part of the casing.

5. The external rear view device according to claim 1, wherein the electrically conductive element and the piezo-electrically active particles of the casing are provided as multi-layered structures with a piezo-electrically active layer being sandwiched between two electrically conductive layers acting as electrodes.

6. The external rear view device according to claim 1, wherein the at least one conductive element comprises at least one of carbon black, carbon nanotubes, carbon nanohorns, graphite, graphene, graphene nanoplatelets, metallic nanoparticles, and conductive polymers.

7. The external rear view device according to claim 1, wherein the piezo-electrically active particles comprise at least one of
   metal-oxide ceramics showing a piezo-electric effect including lead zirconate titanate or calcium bismutate titanate; and
   piezo-electric polymer particles including polyvinylidene fluorides or composites of oxide and polymer materials.

8. The external rear view device according to claim 1, wherein the polymer of at least one of the at least one part of the casing and the polymer layer of the coating comprises at least one of acrylonitrile butadiene styrene, high-density polyethylene, and polypropylene.

9. The external rear view device according to claim 1, wherein the power storage unit comprises at least one of a battery, a capacitor, an ultracapacitor, and a supercapacitor.

10. The external rear view device according to claim 1, wherein the power storage unit comprises at least two electrodes made out of at least one of carbon black, carbon nanotubes, carbon nanohorns, graphite, graphene, and graphene nanoplatelets.

11. The external rear view device according to claim 1, wherein the power storage unit comprises a separator medium including a liquid, a solid, a gas, an air, or a gel.

12. The external rear view device according to claim 1, wherein the power storage unit is connected or suited for being connected to at least one energy consuming device which is at least one of incorporated into and controlled with the help of the rear view device.

13. A motor vehicle comprising the external rear view device according to claim 1.

* * * * *